(12) United States Patent
Nagai

(10) Patent No.: US 10,580,712 B2
(45) Date of Patent: Mar. 3, 2020

(54) WIRING BOARD FOR MOUNTING OPTICAL ELEMENT

(71) Applicant: NGK Spark Plug Co., Ltd., Nagoya-shi, Aichi (JP)

(72) Inventor: Makoto Nagai, Komaki (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/347,676

(22) PCT Filed: Jun. 12, 2017

(86) PCT No.: PCT/JP2017/021662
§ 371 (c)(1),
(2) Date: May 6, 2019

(87) PCT Pub. No.: WO2018/116502
PCT Pub. Date: Jun. 28, 2018

(65) Prior Publication Data
US 2019/0318972 A1    Oct. 17, 2019

(30) Foreign Application Priority Data
Dec. 21, 2016 (JP) ................. 2016-247459

(51) Int. Cl.
*H01L 23/13* (2006.01)
*H01L 23/34* (2006.01)
(Continued)

(52) U.S. Cl.
CPC ............ *H01L 23/13* (2013.01); *H01L 23/34* (2013.01); *H01L 27/14601* (2013.01); *H04N 5/225* (2013.01); *H04N 5/369* (2013.01)

(58) Field of Classification Search
USPC ........................................ 361/767
See application file for complete search history.

(56) References Cited

U.S. PATENT DOCUMENTS

2009/0095725 A1*  4/2009  Ohashi ................ B60N 2/5685
                                                                 219/202
2013/0259430 A1* 10/2013  Tanaka ................ G02B 6/4206
                                                                  385/88

FOREIGN PATENT DOCUMENTS

JP    2004-072572 A     3/2004
JP    2006-278809 A    10/2006
(Continued)

OTHER PUBLICATIONS

Japan Patent Office, International Search Report in International phase of subject application, PCT/JP2017/021662, dated Sep. 5, 2017.

*Primary Examiner* — Andargie M Aychillhum
(74) *Attorney, Agent, or Firm* — Stiles & Harbison, PLLC; Jeffrey A. Haeberlin; James R. Hayne

(57) ABSTRACT

Disclosed is a wiring board on which an optical element is mounted in a state of being sealed by a transparent plate, lens or the like while preventing or reducing the occurrence of condensation or freezing on a surface of the transparent plate, lens or the like. In one embodiment, the wiring board includes: a board body formed with opposed front and back surfaces by stacking of a plurality of ceramic layers (insulating layers); and a plurality of optical element-mounting pads disposed on a bottom surface of a cavity open to the front surface of the board body. The wiring board further includes a heater circuit arranged at the front surface of the board body or an interface of the ceramic layers of the board body along a peripheral side in plan view.

5 Claims, 3 Drawing Sheets

(51) Int. Cl.
*H01L 27/146* (2006.01)
*H04N 5/225* (2006.01)
*H04N 5/369* (2011.01)

(56) References Cited

FOREIGN PATENT DOCUMENTS

| | | | |
|---|---|---|---|
| JP | 2014-143360 A | | 8/2014 |
| JP | 2015216226 | * | 3/2015 |
| JP | 2015-216226 A | | 12/2015 |

* cited by examiner

WIRING BOARD FOR MOUNTING OPTICAL ELEMENT

FIELD OF THE INVENTION

The present invention relates to a wiring board for mounting an optical element such as infrared sensor, image sensor or the like.

BACKGROUND ART

There is proposed a camera system for use in e.g. a mobile phone, mobile terminal or vehicle-mounted camera, which has a downsized and thin structure including: a wiring board mounting on a front surface thereof an image sensor (as an optical element); lower-side outer and upper-side inner holders erected on an outer peripheral region of the front surface of the wiring board; and a lens, a diaphragm and an infrared cut filter disposed in the inner holder (see, for example, Patent Document 1).

In this camera system, the image sensor is mounted in a state of being sealed from the outside by the wiring board, the outer and inner holders and the lens.

During outdoor use of the above-proposed camera system in e.g. a mobile phone, mobile terminal or vehicle-mounted camera, however, condensation or freezing may occur on a surface of the lens or infrared cut filter due to a difference between the outside air temperature and the inside ambient temperature of the camera system. In such a case, an image from the outside is intercepted by the condensation or freezing, whereby there arises a problem that an image captured by the camera system is not accurate or a problem that a part of light from the mounted light-emitting diode (optical element) is not emitted to the outside.

PRIOR ART DOCUMENTS

Patent Document

Patent Document 1: Japanese Laid-Open Patent Publication No. 2004-72572 (Pages 1 to 14; FIGS. 1 to 9)

SUMMARY OF THE INVENTION

Problems to be Solved by the Invention

It is an object of the present invention to provide an optical element-mounting wiring board capable of solving the problems mentioned above in "Background Art" and mounting thereon an optical element such as infrared sensor, image sensor or light-emitting diode in a state of being sealed by a transparent plate, lens or the like while preventing or reducing the occurrence of condensation or freezing on a surface of the transparent plate, lens or the like.

Means for Solving the Problems and Effects of the Invention

To achieve the above object, the present invention has been accomplished with the idea of arranging a heater circuit at or in the vicinity of a peripheral region of a front surface of an insulating material body of the wiring board.

According to one aspect of the present invention (claim 1), there is provided a wiring board for mounting an optical element, comprising: a board body formed of an insulating material with opposed front and back surfaces; and a plurality of optical element-mounting pads disposed on the front surface of the board body or on a bottom surface of a cavity open to the front surface of the board body, wherein the wiring board further comprises a heater circuit arranged at the front surface of the board body or an interface of insulating layers of the board body along a peripheral side in plan view.

In this wiring board, the heater circuit is arranged at the front surface of the board body or the interface of the insulating layers of the board body along the peripheral side in plan view as mentioned above. In a state that the optical element is afterward mounted on the wiring board and sealed from the outside by a transparent plate or lens of glass, the heater circuit functions to prevent the occurrence of condensation or freezing on a surface of the transparent plate or lens even under a large temperature difference between the outside and the inside space in which the optical element is sealed (as "effect (1)"). It is therefore possible for the wiring board to reliably capture an accurate image or reliably emit a predetermined light to the outside even in an extreme temperature environment (as "effect (2)").

The insulating material can be a ceramic material such as alumina or a resin material such as epoxy resin.

The board body can consist of a single insulating layer or a plurality of insulating layers stacked integrally together.

A transparent lid plate or the like is joined to a peripheral region of the front surface of the board body or the front surface of the board body shaped in a rectangular frame in plan view around the opening of the cavity.

The transparent lid plate can be in the form of, but is not limited to, a sealing material capable of allowing a visible, infrared or ultraviolet light to pass therethrough. The sealing material may also have the lens function of changing the optical path of the light.

The optical element can be a light-receiving element (such as image sensor, infrared sensor etc.) or a light-emitting element (such as light-emitting diode (hereinafter referred to as "LED element"), laser diode (hereinafter referred to as "LD element"), CMOS element etc.).

In the case where the board body is formed of a high-temperature fired ceramic material such as alumina, conductor layers of the heater circuit can be formed of tungsten (W) or molybdenum (Mo) each of which is capable of being co-fired with a green sheet of the high-temperature fired ceramic material. Further, the conductor layers can be made relatively thin in thickness or relatively narrow in width as compared to conventional wiring layers.

In the case where the board body is formed of a low-temperature fired ceramic material such glass-ceramic composition or a resin material such as epoxy resin, by contrast, the conductor layers can be formed of e.g. a conductive resin material containing carbon black (as a fine powder) and graft polymer.

Further, the heater circuit can formed by planer elements or by combination of planer elements and linear (rod-shaped) elements as via conductors.

Herein, the interface of the insulating layers of the board body preferably refers to an "interface of any ones of a plurality of insulating layers of the board body located relatively close to the front surface of the board body.

According to another aspect of the present invention (claim 2), there is provided a wiring board for mounting an optical element as described above, wherein the heater circuit has a meandering shape in plan view at the front surface of the board body or the interface of the insulating layers of the board body.

In this wiring board, the heater circuit has a meandering shape in plan view at the front surface of the board body or the interface of the insulating layers of the board body as mentioned above. The length of such a meandering-shaped heater circuit is made longer than that of a straight linear-shaped heater circuit so as to achieve an improvement of heating efficiency. Thus, the above-mentioned effects (1) and (2) are easily obtained.

For example, the meandering-shaped heater circuit in plan view is configured as a planer conductor of zigzag pattern etc. at the front surface of the board body or at the interface of the insulating layers of the board body.

The wording "meandering shape" can be the shape of a series of alternately inverted square-cornered U-shapes, the shape of a series of alternately inverted U-shapes, the shape of a series of alternately inverted V-shapes, the shape of a series of M-shapes or the like.

According to still another aspect of the present invention (claim 3), there is provided a wiring board for mounting an optical element as described above, wherein the heater circuit has a meandering shape, in side view perpendicular to plan view, between the front surface of the board body and the interface of the insulating layers of the board body or between different interfaces of the insulating layers of the board body.

Even in this wiring board, the heater circuit has a meandering shape in side view perpendicular to plan view between the front surface of the board body and the interface of the insulating layers of the board body, or between different interfaces of the insulating layers of the board body, so as to thereby achieve an improvement of heating efficiency. The above-mentioned effects (1) and (2) are thus easily obtained.

For example, the meandering-shape heater circuit in side view is configured mainly including: planer conductor layers arranged at the front surface of the board body and at the interface of the insulating layers of the board body, or planer conductor layers arranged at the different interfaces of the insulating layers of the board body; and via conductors passing through the insulating layer in a thickness direction and connecting end portions of these planer conductor layers.

According to yet another aspect of the present invention (claim 4), there is provided a wiring board for mounting an optical element as described above, wherein the heater circuit has a meandering shape in plan view at the front surface of the board body or the interface of the insulating layers of the board body and has a meandering shape, in side view perpendicular to plan view, between the front surface of the board body and the interface of the insulating layers of the board body or between different interfaces of the insulating layers of the board body.

In this wiring board, the heater circuit has a meandering shape in plan view at the front surface of the board body or the interface of the insulating layers of the board body and has a meandering shape, in side view perpendicular to plan view, between the front surface of the board body and the interface of the insulating layers of the board body or between different interfaces of the insulating layers of the board body. The length of such a meandering-shaped heater circuit is made further longer so as to achieve a further improvement of heating efficiency. Thus, the above-mentioned effects (1) and (2) become more pronounced.

According to yet still another aspect of the present invention (claim 5), there is provided a wiring board for mounting an optical element as described above, further comprising a pair of current conduction paths respectively connected to both ends of the heater circuit and extending to the back surface or a side surface of the board body.

In this wiring board, the current conduction paths for current supply to the heater circuit are arranged separately from current conduction paths to the optical element-mounting pads. As two types of currents of different voltages etc. are supplied through the respective current conduction paths, the occurrence of an electrical failure is easily reduced (as "effect (3)").

DESCRIPTION OF EMBODIMENTS

Exemplary embodiments of the present invention will be described in detail below with reference to the drawings.

Figure 1:
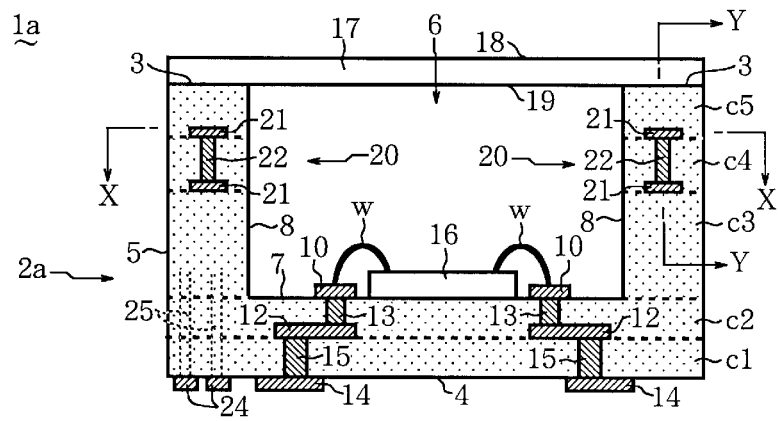
FIG. 1 is a vertical cross-sectional view of a wiring board for mounting an optical element according to one embodiment of the present invention.
Figure 2:
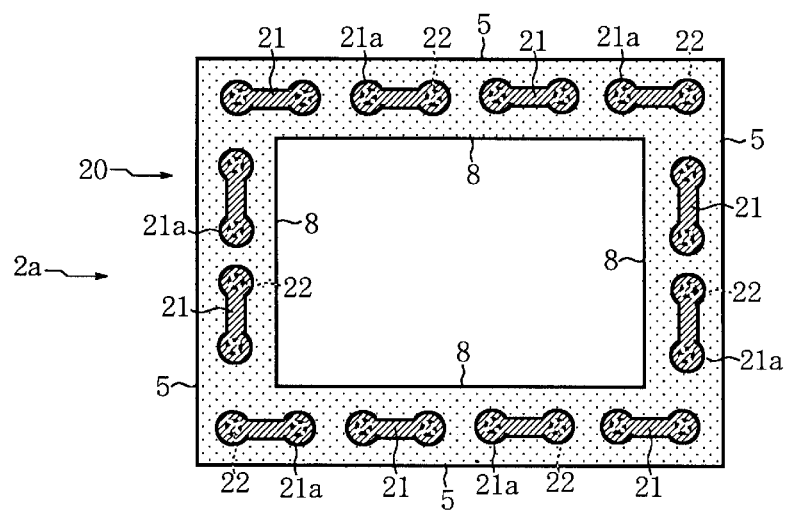
FIG. 2 is a horizontal cross-sectional view of the wiring board taken along line X-X of FIG. 1.
Figure 3:
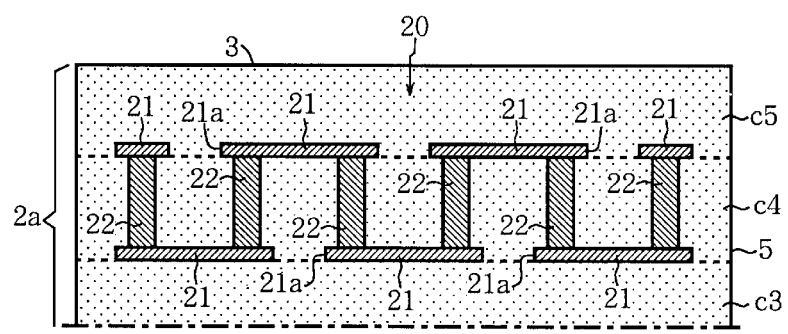
FIG. 3 is a vertical cross-sectional view of part of the wiring board taken along line Y-Y of FIG. 1.

FIG. 1 is a vertical cross-sectional view of an optical element-mounting wiring board (hereinafter simply referred to as "wiring board") 1a according to one embodiment of the present invention. FIG. 2 is a horizontal cross-sectional view of the wiring board 1a as taken along line X-X of FIG. 1. FIG. 3 is a vertical cross-sectional view of part of the wiring board 1a as taken along line Y-Y of FIG. 1.

As shown in FIGS. 1 to 3, the wiring board 1a includes: a board body 2a having a box shape as a whole with opposed front and back surfaces 3 and 4; a cavity 6 open to a center region of the front surface 3; and a plurality of (e.g. a pair of) optical element-mounting pads 10 disposed on a bottom surface 7 of the cavity 6.

The board body 2a has plate-shaped ceramic layers c1 and c2 and rectangular (quadrangular) frame-shaped ceramic layers c3 to c5 in plan view stacked integrally together to define four side surfaces 5 on the outer periphery of the board body. For example, the ceramic layers (insulating layers) are formed of a high-temperature fired ceramic material such as alumina or aluminum nitride.

The cavity 6 has a rectangular (quadrangular) bottom surface 7 in plan view and a plurality of side surfaces 8 erected on four sides of the bottom surface 7. As shown in FIG. 1, a LED element (as an optical element) 16 is afterward mounted on a center region of the bottom surface 7.

Via conductors 13 are formed through the ceramic layer c2 at positions immediately below the optical element-mounting pads 10 and respectively connected to the optical element-mounting pads 10. A plurality of wiring layers 12 are arranged between the ceramic layers c1 and c2 and respectively connected at one end portions thereof to the via conductors 13. Further, via conductors 15 are formed through the ceramic layer c1 to respectively connect the other end portions of the wiring layers 12 to a plurality of outer connection terminals 14 on the back surface of the board body 2a.

The optical element-mounting pads 10, the via conductors 13 and 15, the wiring layers 12 and the outer connection terminals 14 are formed predominantly of tungsten (hereinafter simply referred to as "W") or molybdenum (hereinafter simply referred to as "Mo") in the present embodiment.

As shown in FIGS. 1 to 3, a heater circuit 20 is arranged between the ceramic layers c3 to c5, which are situated around the side surfaces 8 of the cavity 6 and relatively close to the front surface 3 of the board body 2a, along the periphery of the front surface 3 in plan view and along the respective side surfaces 8 of the cavity 6.

The heater circuit 20 includes a plurality of heater portions 21 formed separately at interfaces between the ceramic layers c3 and c4 and between the ceramic layers c4 and c5 and aligned along the respective side surfaces 5 of the board body 2a and the respective side surfaces 8 of the cavity 6. The heater portions 21 each have a rectangular shape in plan view. Connection sections 21a are formed symmetrically on both longitudinal ends of the heater portions 21 and each have a circular shape in plan view with a diameter larger than a width of the rectangular sections of the heater portions 21. Each of these heater portions 21 is about several mm to several tens of mm in thickness.

As shown in FIG. 3, the rectangular sections of the plurality of heater portions 21 between the ceramic layers c3 and c4 and the rectangular sections of the plurality of heater portions 21 between the ceramic layers c4 and c5 are in a staggered arrangement in side view perpendicular to plan view; and the connection sections 21a of the heater portions 21 between the ceramic layers c3 and c4 and the connection sections 21a of the heater portions 21 between the ceramic layers c4 and c5 respectively overlap each other in plan view. Via conductors 22 are formed through the ceramic layer c4 to connect overlapping ones of the connection sections 21a. In other words, the heater circuit 20 has a structure in which the plurality of heater portions 21 arranged in two upper and lower rows and the via conductors 22 arranged therebetween form a meandering shape (i.e. the shape of a series of alternately inverted square-cornered U-shapes) in side view as shown in FIG. 3. In the present embodiment, each of the via conductors 22 is circular in cross section with a diameter size of about 10 to 100 μm. The via conductors 22 may alternatively be square with side lengths sized in the above range or rectangular with both of long- and short-side lengths sized in the above range.

As shown in FIG. 1, the heater circuit 20 further includes a plurality of current conduction paths 25 respectively connecting the connection sections 21a of the heater portions 21 on both ends of the heater circuit 20 to a pair of electrode pads 24 on the back surface 4 of the board body 2a. The current conduction paths 25 are each formed by a series of via conductors.

The heater portions 21, the via conductors 22, the electrode pads 24 and the current conduction paths 25 are also be formed predominantly of W or Mo in the present embodiment. The pair of electrode pads 24 may alternatively be arranged side by side on the side surface 5 of the board body 2a and connected to the pair of current conduction paths 25 at positions between the ceramic layers c4 and c5.

Figure 4:
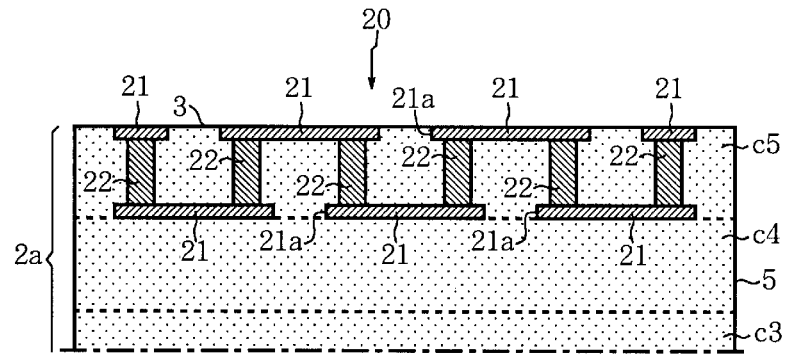
FIG. 4 is a vertical cross-sectional view of part of the wiring board, taken similar to FIG. 3, but showing an alternative form of heater circuit.

As shown in FIG. 4, the heater circuit 20 may alternatively have a structure in which a plurality of heater portions 21 formed with upper surfaces thereof flush with the front surface 3 of the board body 2a; a plurality of heater portions 21 formed at an interface between the front surface 3-side ceramic layers c4 and c5 are connected by a plurality of via conductors 22 through the uppermost ceramic layer c5 so as to form a meandering shape in the same manner as above in side view perpendicular to plan view.

Herein, the heater portions 21, the via conductors 22 and the like as the constituent parts of the heater circuit 20 are co-fired with the ceramic layers c1 to c5 during manufacturing of the wiring board.

As shown in FIG. 1, the LED element 16 is mounted to the center region of the bottom surface 7 of the cavity 6 via a brazing material (not shown) and brought into conduction with the optical element-mounting pads 10 by bonding wires W, respectively. The LED element 16 may be alternatively directly mounted to upper surfaces of the plurality of optical element-mounting pads 10 via a brazing material.

After that, a transparent plate 17 of borosilicate glass etc. is joined to the front surface 3 of the board body 2a by brazing etc. The LED element 16 is hence mounted in a state of being sealed from the outside.

In the case where the wiring board 1a is used in e.g. an extreme cold place or alpine zone, the temperature difference between the ambient temperature of the inside of the cavity 6 sealed by the transparent plate 17 and the outside air temperature may reach several tens degrees Celsius. Even in such a case, the plurality of heater portions 21 and via conductors 22 perform the heating function with the supply of current to the heater circuit 20. As a consequence, the temperature difference between a pair of plate surfaces 18 and 19 of the transparent plate 17 is reduced to reliably prevent the occurrence of condensation or freezing on the plate surface 18, 19.

Therefore, the wiring board 1a with the above-structured heater circuit 20 reliably obtains the aforementioned effects (1), (2) and (3).

Furthermore, the heater circuit 20 is arranged between the rectangular frame-shaped ceramic layers c3 to c5, each of which is rectangular frame-shaped in plan view, in the wiring board 1a in which the optical element such as LED element 16 is mounted on the bottom surface 7 of the cavity 6 of the board body 2a as shown in FIG. 1. In this arrangement, the distance between the heater circuit 20 and the optical element is set relatively long. The optical element is thus prevented from being influenced by heat generated from the heater circuit 20.

Figure 5:
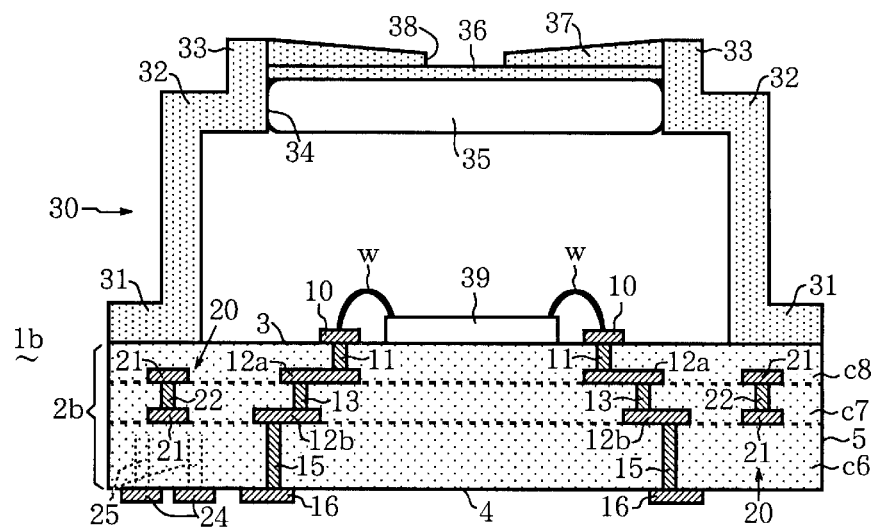
FIG. 5 is a vertical cross-sectional view of a wiring board for mounting an optical element according to another embodiment of the present invention.

FIG. 5 is a vertical cross-sectional view of a wiring board 1b according to another embodiment of the present invention.

As shown in FIG. 5, the wiring board 1b includes: a plate-shaped board body 2b having opposed front and back surfaces 3 and 4 and side surfaces 5 extending between the front and back surfaces 3 and 4; and a plurality of optical element-mounting pads 10 disposed on a center region of the front surface 3 in plan view.

The board surface 2b has ceramic layers c6 to c8 stacked integrally together. These ceramic layers are formed of the same ceramic material as in the above embodiment and. Wiring layers 12a and 12b, which are similar to those in the above embodiment, are arranged between the ceramic layers c6 to c8. Further, via conductors 11, 13 and 15 are respectively formed as connections between the optical element-mounting pads 10 and the wiring layers 12a, between the wiring layers 12a and the wiring layers 12b and between the wiring layers 12a and a plurality of outer connection terminals 16 on the back surface 4 of the board body 2b.

A heater circuit 20, in which a plurality of heater portions 21 and a plurality of via conductors 22 are alternately connected to form a meandering shape in side view in the same manner as in the above embodiment, is arranged between the ceramic layers c6 to c8 of the board body 2a along the periphery of the front surface 3 as shown in FIG. 5.

Figure 6:
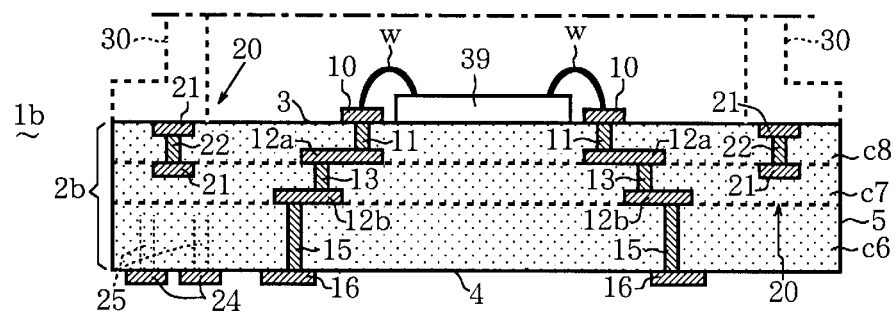
FIG. 6 is a vertical cross-sectional view of part of the wiring board, showing an alternative form of heater circuit arrangement.

As shown in FIG. 6, the heater circuit 20 may alternatively have a structure in which a plurality of heater portions 21 formed with upper surfaces thereof flush with the front surface 3 of the board body 2b and a plurality of heater portions 21 formed at an interface between the front surface 3-side ceramic layers c7 and c8 are connected by a plurality of via conductors 22 through the uppermost ceramic layer c8 so as to form a meandering shape in side view in the same manner as above.

As shown in FIGS. 5 and 6, both ends of the heater circuit 20 are respectively connected by a pair of current conduction paths 25 to a pair of electrode pads 24 on the back surface 4 of the board body 2b.

An image sensor (as an optical element) 39 is mounted on the center region of the front surface 3 of the board body 2b and brought into conduction with the optical element-mounting pads 10 by bonding wires W, respectively, as shown in FIGS. 5 and 6.

As shown in FIG. 5, a holder 30 having a cylindrical shaped as a whole is joined at a bottom portion 31 thereof to a peripheral region of the front surface 3 of the board body 2b; and a transparent lens 35, an infrared cut filter 36 and a diaphragm 36 having an aperture 38 with an adjustable inside diameter are disposed in an inner space 34 of upper-side horizontal and vertical portions 32 and 33 of the holder 30. The image sensor 39 is hence mounted in a state of being sealed from the outside.

In the case where the wiring board 1b is placed in the above-mentioned extreme temperature environment, the temperature difference between the inside in which the image sensor 39 is sealed by the holder 30 and the lens 35 and the outside may become significantly large. Even in such a case, the plurality of heater portions 21 and via conductors 22 performs the heating function with the supply of current to the heater circuit 20. As a consequence, the temperature difference between surfaces of the lens 35 and between surfaces of the infrared cut filter 36 is reduced to reliably prevent the occurrence of condensation or freezing on the surfaces of the lens and of the infrared cut filter. Therefore, the wiring board 1b with the above-structured heater circuit 20 also reliably obtains the aforementioned effects (1), (2) and (3).

Figure 7:
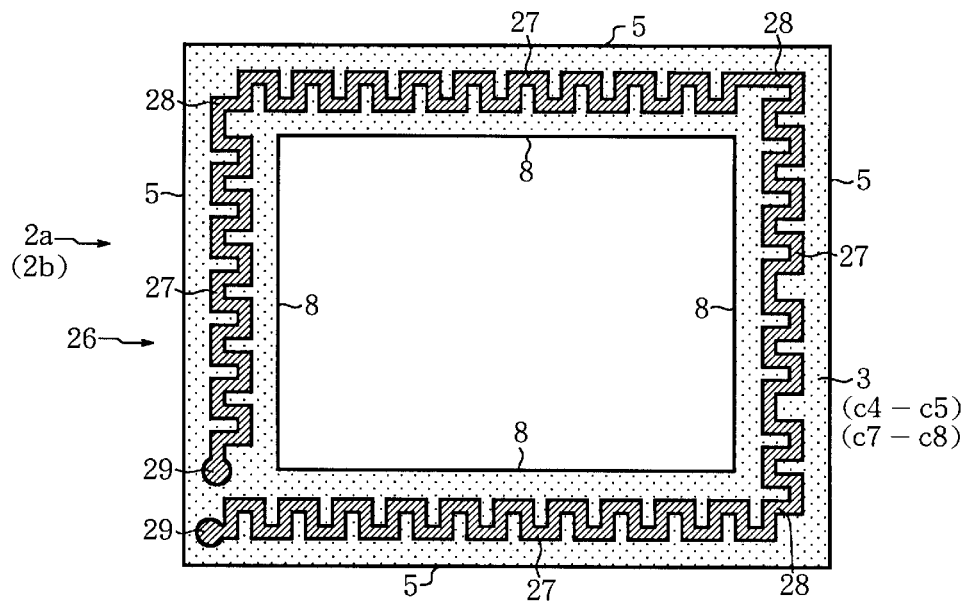
FIG. 7 is a horizontal cross-sectional view of part of the wiring board, taken similar to FIG. 2, but showing another alternative form of heater circuit.

FIG. 7 is a view in plan of an alternative form of heater circuit 26 arranged at the front surface 3 of the board body 2a of the wiring board 1a along its peripheral side.

As shown in FIG. 7, the heater circuit 26 includes: heater portions 27 formed in a meandering shape consisting of a series of alternately inverted square-cornered U-shapes in plan view, on respective four sides of the front surface 3 of the board body 2a along the side surfaces 5 of the board body 2a and the side surfaces 8 of the cavity 6; connection portions 28 formed in an L-shape in plan view on three corners of the front surface as connections between adjacent ones of the heater portions 27; and a pair of end portions 29 formed in a circular shape in plan view on the remaining one corner of the front surface. A pair of current conduction paths 25 are respectively connected to the end portions 29.

The heater circuit 26 may alternatively be arranged at the interface (c4-c5) between the ceramic layers c4 and c5 of the board body 2a, or may be arranged between the front surface 3 and the ceramic layer c8 of the board body 2b of the wiring board 1b or at the interface (c7-c8) between the ceramic layers c7 and c8 of the board body 2b of the wiring board 1b.

The wiring board 1a, 1b, even when provided with the above-structured heater circuit 26, obtains at least the aforementioned effects (1) and (2).

Figure 8:
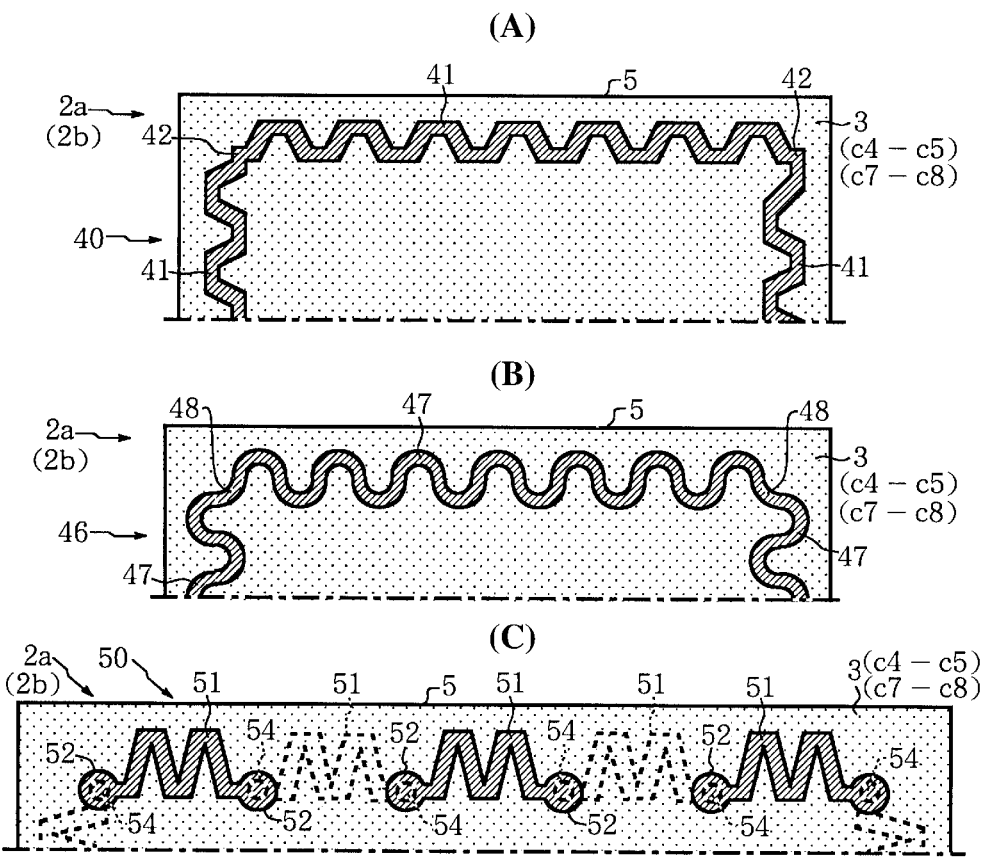
FIGS. 8(A) to 8(C) are horizontal cross-sectional views of part of the wiring board, showing other alternative forms of heater circuits.

FIG. 8(A) is a partial view in plan of another alternative form of heater circuit 40.

As shown in FIG. 8(A), the heater circuit 40 includes: heater portions 41 formed in a meandering shape consisting of a series of alternately inverted V-shapes in plan view on respective four sides of the front surface 3 of the board body 2a along the periphery of the front surface 3; and connection portions 42 formed in an L-shape in plan view as connections between adjacent ends of the heater portions 41.

As shown in FIG. 8(B), a heater circuit 46 may be provided including: heater portions 47 formed in a meandering shape consisting of a series of alternately inverted U-shapes in plan view on respective four sides of the front surface 3 of the board body 2 along the periphery of the front surface 3; and connection portions 48 formed in a circular shape in plan view as connects adjacent ends of the heater portions 47.

Each of the heater circuits 40 and 46 may alternatively be arranged at the interface (c4-c5) between the ceramic layers c4 and c5 of the board body 2a, or may be arranged between the front surface 3 and the ceramic layer c8 of the board body 2b of the wiring board 1b or at the interface (c7-c8) between the ceramic layers c7 and c8 of the board body 2b of the wiring board 1b.

FIG. 8(C) is a partial view in plan of still another form of heater circuit 50.

As shown in FIG. 8(C), the heater circuit 50 includes: a plurality of heater portions 51 formed in a meandering M-shape in plan view at positions spaced apart from each other at the front surface 3 along its peripheral side; and a plurality of heater portions 51 formed in the same meandering shape as the above heater portions at the interface between the ceramic layers c4 and c5. The plurality of heater portions 51 at the front surface 3 and the plurality of heater portions 51 at the interface between the ceramic layers c4 and c5 are in a staggered arrangement in side view perpendicular to plan view. Connection sections 52 are formed in a circular shape in plan view on both ends of the respective heater portions 51. Via conductors 54 are formed through the uppermost ceramic layer c5 to respectively connect the connection sections of the heater portions 51 at the front surface 3 to the connection sections 51 of the heater portions 51 between the ceramic layers c4 and c5. In other words, the heater circuit 50 has a meandering shape consisting of a plurality of M-shapes in plan view and, at the same time, has a meandering shape consisting of a series of alternately inverted square-cornered U-shapes in side view.

The heater circuit 50 may alternatively be arranged at the interface (c4-c5) between the ceramic layers c4 and c5 of the board body 2a, or may be arranged between the front surface 3 and the ceramic layer c8 of the board body 2b of the wiring board 1b or at the interface (c7-c8) between the ceramic layers c7 and c8 of the board body 2b of the wiring board 1b.

The wiring board 1a, 1b, even when provided with the heater circuit 40, 46, obtains at least the aforementioned effects (1) and (2).

The wiring board 1a, 1b, when provided with the heater circuit 50, more efficiently obtains the aforementioned effects (1) and (2) because of the longer current conduction paths of the heater circuit 50.

The present invention is not limited to the above-mentioned embodiments.

For example, the board body may alternatively consist of a single insulating layer. In this case, the heater circuit 20, 26, 40, 46, 50 is arranged at the front surface 3 of the board body along its peripheral side.

In the case where the board body 2a, 2b is formed of a glass-ceramic composition, epoxy resin or the like, the respective constituent parts of the heater circuit 20, 26, 40, 46, 50 may be formed by bonding an insulating sheet to which a flat pattern of carbon black has been applied, or a rod (wire) of carbon, to a predetermined position.

The heater circuit 20, 50 with the via conductors 22, 54 may be arranged in a meandering shape across three or more layers in the thickness direction (i.e. in side view) including the front surface 3 of the board body 2a, 2b.

A heater circuit may be provided with any appropriate combination of the heater portions 21, 27, 41, 47, 51.

INDUSTRIAL APPLICABILITY

The optical element-mounting wiring board according to the present invention is suitably used for mounting an optical element such as infrared sensor, image sensor or LED element in a state of being sealed by a transparent plate, lens or the like while preventing or reducing the occurrence of condensation or freezing on a surface of the transparent plate, lens or the like.

DESCRIPTION OF REFERENCE NUMERALS

1a, 1b: Optical element-mounting wiring board
2a, 2b: Board body
3: Front surface
4: Back surface
5: Side surface
6: Cavity
7: Bottom surface
10: Optical element-mounting pad
16: LED element (as optical element)
20, 26, 40, 46, 50: Heater circuit
39: Image sensor (as optical element)
c1 to c8: Ceramic layer (as insulating layer)

What is claimed is:

1. A wiring board for mounting an optical element, comprising:
    a board body formed of an insulating material with opposed front and back surfaces; and
    a plurality of optical element-mounting pads disposed on the front surface of the board body or on a bottom surface of a cavity open to the front surface of the board body,
    wherein the wiring board further comprises a heater circuit arranged at the front surface of the board body or an interface of insulating layers of the board body; and
    wherein in a plan view, the heater circuit is arranged in a peripheral region outward of the plurality of optical element-mounting pads.

2. The wiring board for mounting the optical element according to claim 1,
    wherein the heater circuit has a meandering shape in plan view at the front surface of the board body or the interface of the insulating layers of the board body.

3. The wiring board for mounting the optical element according to claim 1,
    wherein the heater circuit has a meandering shape, in side view perpendicular to plan view, at least either between the front surface of the board body and the interface of the insulating layers of the board body or between different interfaces of the insulating layers of the board body.

4. The wiring board for mounting the optical element according to claim 1,
    wherein the heater circuit has a meandering shape in plan view at the front surface of the board body or the interface of the insulating layers of the board body and has a meandering shape, in side view perpendicular to plan view, between the front surface of the board body and the interface of the insulating layers of the board body or between different interfaces of the insulating layers of the board body.

5. The wiring board for mounting the optical element according to claim 1, further comprising a pair of current conduction paths respectively connected to both ends of the heater circuit and extending to the back surface or a side surface of the board body.

* * * * *